United States Patent

Hara et al.

[11] Patent Number: 5,250,229
[45] Date of Patent: Oct. 5, 1993

[54] SILVER-RICH CONDUCTOR COMPOSITIONS FOR HIGH THERMAL CYCLED AND AGED ADHESION

[75] Inventors: Hiroyuki Hara, Kanagawa, Japan; Marc H. La Branche, Wilmington, Del.; Barry E. Taylor, Tokyo, Japan

[73] Assignee: E. I. Du Pont de Nemours and Company, Wilmington, Del.

[21] Appl. No.: 774,788

[22] Filed: Oct. 10, 1991

[51] Int. Cl.$^5$ .......................... H01B 1/00; H01B 1/02; H01B 1/08

[52] U.S. Cl. .................................. 252/518; 252/519; 252/514; 420/502; 420/504

[58] Field of Search .................. 252/518, 519, 514; 420/502, 504

[56] References Cited

U.S. PATENT DOCUMENTS

| | | | |
|---|---|---|---|
| 553,421 | 3/1976 | Horowitz | 252/514 |
| 3,725,836 | 4/1973 | Wada et al. | 252/518 |
| 3,838,071 | 9/1974 | Amin | 252/514 |
| 3,896,054 | 7/1975 | Larry | 106/1 |
| 4,001,146 | 1/1977 | Horowitz | 252/518 |
| 4,090,009 | 5/1978 | Horowitz | 428/208 |
| 4,094,061 | 6/1978 | Gupta et al. | 252/518 |
| 4,318,830 | 3/1982 | Horowitz | 252/519 |
| 4,323,483 | 4/1982 | Rellick | 252/518 |
| 4,381,945 | 5/1983 | Nair | 106/1.14 |
| 4,559,167 | 12/1985 | Jülke et al. | 252/518 |
| 4,808,223 | 2/1989 | Ozaki et al. | 252/514 |
| 4,863,683 | 9/1989 | Nakatani et al. | 252/518 |

FOREIGN PATENT DOCUMENTS 0064700 5/1982 European Pat. Off. .
2190893 2/1974 France .
2018035 11/1978 United Kingdom .

OTHER PUBLICATIONS

JP 60 030005, Sumitomo Metal Mini KK Feb. 15, 1985.
JP 59 155988, Sumitomo Metal Mini KK Sep. 5, 1984.
JP 79 127564, Tanaka Matthey KK May 12, 1981.
JP 81 180480, Shoei Kagaku Kogyo May 18, 1983.
JP 77 126898, Toyo Dengu Senisaku May 15, 1979.

Primary Examiner—Paul Lieberman
Assistant Examiner—Mark Kopec

[57] ABSTRACT

The invention is directed to a thermal cycle adhesion additive composition consisting essentially of an admixture of finely divided particles of oxides of bismuth, copper, lead, zinc, and transition metal and to conductive thick film compositions made therefrom.

19 Claims, 2 Drawing Sheets

SILVER-RICH CONDUCTOR COMPOSITIONS FOR HIGH THERMAL CYCLED AND AGED ADHESION

FIELD OF INVENTION

This invention is directed to thick film conductor compositions and particularly to thick film conductor pastes which have high aged adhesion, high thermal cycled adhesion, good solderability and good solder leach resistance.

BACKGROUND OF THE INVENTION

The use of thick film conductors in hybrid microelectronic circuits is well known in the electronic field. Such materials are generally comprised of a dispersion of finely divided noble metal or metal alloy powders, with a mixture of metal oxide or metal oxide-forming powders and glasses with an organic vehicle to form a paste-like material. The consistency and rheology of the paste are adjusted to give suitable performance with the particular method of application such as screen printing, brushing, dipping, extrusion, spraying or syringe dispensing. Such pastes are generally applied to a suitable substrate material such as 96–99% alumina to give a patterned thick film conductor layer. The paste is generally dried at temperatures of 100°–150° C. to get rid of the volatile components and then the patterned conductor is fired, typically in a belt furnace, to burn out the non-volatile organics (e.g., ethyl cellulose, resins, rosins, thixotropic agents), and to sinter metal particles, thereby densifying the metal film.

There are several performance-related properties which the conductor paste and subsequently the fired conductor film must possess in order for the product to be commercially viable. It is often necessary to balance the chemistry and metallurgy of the thick film paste composition in order to obtain an acceptable level of overall performance, since the materials used to make the conductor can sometimes affect the performance in different ways.

The processing of the materials described herein is conventional, i.e., the belt furnaces, printers, drying equipment are standard and well known to those familiar to the art of electronic thick films. Furnaces which have generally been used are convection heated with heavy gauge resistance wire elements imbedded in ceramic refractory material.

Although the processing of the materials of the present invention may be considered "standard", the properties of the materials after processing are "state-of-the-art". For example, many of the advanced applications of today require a combination of performance properties which before now have been impossible to achieve with thick film materials of the past. These properties are:
thermal cycle adhesion
thermal aged adhesion
solder leach resistance
soderability/solder acceptance
conductivity.

All of these properties relate to the ease with which circuits can be manufactured and the reliability of the final circuits. For example, one of the most recent reliability requirements of thick film conductors in a wide range of applications pertains to the "thermal cycle adhesion" (TCA) or ability of a soldered thick film conductor to withstand repeated cyclings from low to high temperature. Particularly when solder is employed, these cyclings cause a rapid degradation of the thick film adhesion to the substrate material, ultimately leading to total loss of adhesion in the worst case. Thus, there is a great need for a way to obtain high thermal cycle adhesion values need for a way to obtain high thermal cycle adhesion values without losing any of the other equally important performance properties.

SUMMARY OF THE INVENTION

The invention is directed in its primary aspect to a thermal cycle adhesion additive composition consisting essentially of an admixture of finely divided particles of oxides of bismuth, copper, lead, zinc and a transition metal selected from iron, cobalt, nickel and mixtures thereof in which the weight ratio of (a) copper oxide to bismuth oxide and lead oxide is 0.01–2, (b) lead oxide to bismuth oxide and lead oxide is 0–1, (c) zinc oxide to bismuth oxide and lead oxide is 0.01–2, and (d) transition metal oxide to bismuth oxide and lead oxide is 0.01–2.

In a second aspect, the invention is directed to screen-printable thick film compositions for making solderable electrically conductive layers comprising an admixture of finely divided particles containing by weight percent (1) 85–99.9% of at least one solderable electrically conductive metal, and (2) 15–0.1% of the above described additive composition.

PRIOR ART

U.S. Pat. No. 4,381,945, Nair, discloses Ag/Pd/Pt metallizations with Pd/Ag ratios of 0.06:1 to 1.5:1, and which make use of low melting glass and organotitanates.

U.S. Pat. No. 4,318,830, Horowitz, describes compositions containing Ag, Pt and Pd with Ag/Pt ratios of 2.3:1 to 12:1 and Ag/Pd ratios of 2.5:1 to 12:1, which also contain cobalt oxide as part of the inorganic binder.

JP 60 030005, Sumitomo Metal Mini KK, describes metallizations consisting of Ag, Au, Pt, Pd, etc. powders combined with glass powder and metal salts of Cu, Zn, Co, Mn, Pb, Ca, etc.

JP 59 155988, Sumitomo Metal Mini KK, describes conductive paste containing at least one of the metal powders of Au, Ag, Cu, Pt, Pd, Ni, and Al, a glass powder, as well as a titanate coupling agent.

JP 83 180480, Shoei Kagaku Kogyo, describes conductive paints comprised of Au, Ag, Pd, Pt, Cu, Ni, Zn and their oxides and glasses of the classes $SiO_2$-$Al_2O_3$-CaO, ZnO-PbO-$B_2O_3$, PbO-$SiO_2$-$B_2O_3$, and PbO-$SiO_2$.

JP 79 127564, Tanaka Matthey KK, describes conductive compositions comprised of Ag, Pt, and/or Pd powder, and powdery inorganic binder consisting of glass frit containing ZnO-$B_2O_3$-PbO-$SiO_2$-$SnO_2$-$MnO_2$-$Bi_2O_3$.

JP 77 126898, Toyo Dengu Senisaku, describes conductive paste consisting of Ag, Au, Pt, or Pd; zinc glass of Zn-$B_2O_3$-$SiO_2$ and $Bi_2O_3$.

DETAILED DESCRIPTION OF THE INVENTION

Introduction

Figure 1:
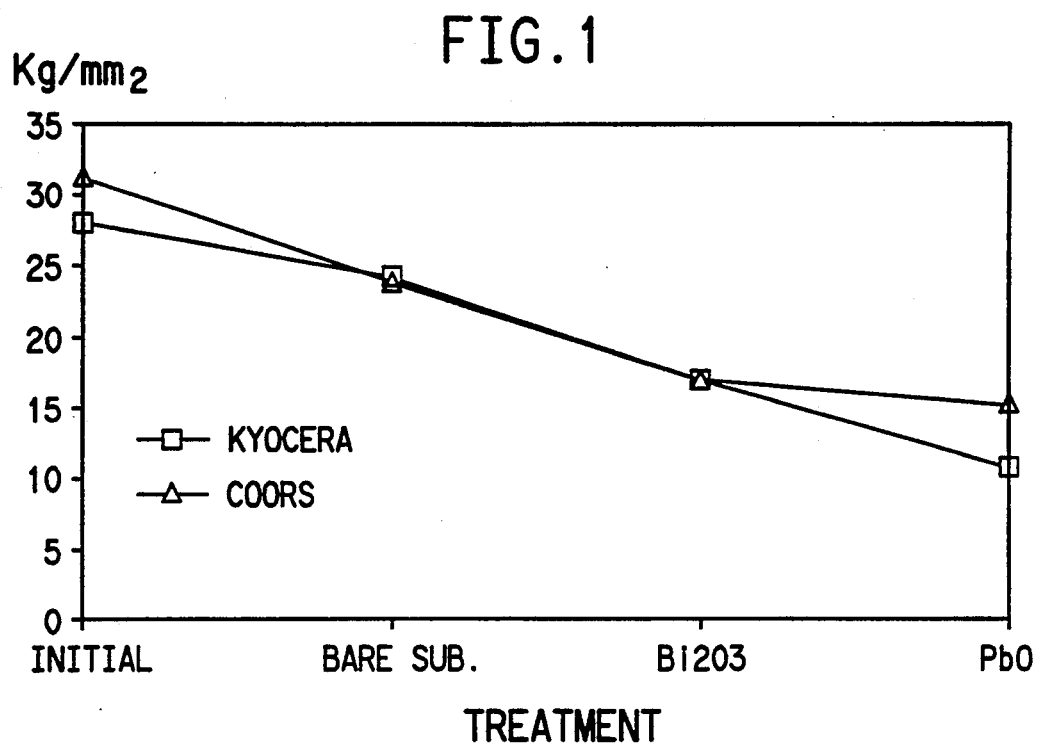
FIG. 1 is a graphical correlation showing the effect of various materials on substrate bending strength.

Some of the ost severe thermal cycle conditions and requirements today are found in automotive electronic applications. High palladium-containing pastes have therefore traditionally been used in automotive circuits because of their good aged adhesion and thermal cycled adhesion, for example, 2.5/1 or 3/1 Ag/Pd pastes. However, the trend to lower cost, higher conductivity, and higher reliability is driving the conductor metallurgies to lower precious metal contents, and even to pure silver or silver with a small amount of platinum (Pt/Ag ratios of 2/100 or less). This trend of reducing the Pd content puts greater demands on adhesion reliability, both thermal cycled adhesion and aged adhesion.

A balance of properties (aged adhesion, thermal cycled adhesion, solderability, solder leach resistance, and conductivity), can be obtained by careful selection and control of the metallurgy, the metal powder properties, and the inorganic binder composition and particle size. One important factor is to use silver powders with good packing and uniformity, thus providing a dense fired film free of pinholes and agglomerates. Precious metal additions such as Pt or Pd can be added to the paste to improve the overall solderability and leach resistance. The inorganic binder is based on the $Bi_2O_3/PbO$ flux system, with added CuO, ZnO, and transition metal oxides as aged adhesion promoters. Precursors to these oxides can also be used. By the term "percursors" is meant materials which upon firing in air are decomposed to form metal oxides. Examples of such precursors are oxalates, carbonates, nitrates, organometallic compounds and the like. Small amounts of glass frit can optionally be added to such formulations in order further to improve the bonding and densification of the film.

This invention is especially useful for pure silver compositions, or silver with small alloy additions such as platinum, palladium, etc. It is primarily intended for firing on alumina-rich substrates, e.g., 96% alumina. However, it can also be fired onto other dielectric-layers, though the long term aged adhesion over dielectric may be lower than over 96% alumina. Other suitable substrates are 90% alumina, cordierite, mullite, thick film dielectrics, etc. For dense firing, Ag-rich compositions, little or no glass frit is needed to aid the bonding and densification. This situation contrasts with higher palladium and/or platinum-containing pastes. For instance, 3/1 Ag/Pd ratio compositions can have (total inorganic binder)/(metal powder) ratios as high as 1/6 to 1/4 by weight. Pure silver or silver with less than 5-10% alloy additions can have ratios from 1/10 to 1/300.

When large glass and inorganic binder levels are added to high silver-containing formulations, high aged adhesion to the substrate can be developed. However, serious degradation in solderability and solder leach resistance typically occurs. With higher palladium-containing pastes, larger glass or inorganic binder levels are not only tolerated, in fact they are required because the conductor densifies more slowly and less completely during firing. The difference is related to the different melting points of pure silver (960° C.) and Pd/Ag (ca. 1220° C. for 30% Pd 70% Ag by weight). Silver metal by itself will sinter to essentially complete densification at 850° C. without any inorganic binder additions, so a minimum level of the binder should be used with pure Ag or nearly pure Ag metallurgies. These differences allow for an easier formulation window with higher Pd pastes (e.g., 3/1 Ag/Pd ratio) versus high Ag compositions. The invention is therefore directed to a very efficient binder system for high Ag compositions which will give a good balance of adhesion and solderability properties.

Inorganic Binder System

A key was found to obtaining higher bonding strengths of high Ag compositions to alumina substrates with the development of a unique combination of reactive oxide binders. The system is based on Bi-Pb-Cu-Zn-transition metal oxides (TMO). The use in this system of oxides of Pb is optional, but preferred.

The system is designed to have the maximum reactivity with $Al_2O_3$. The key reaction products are designed to be compounds with $Al_2O_3$ and oxides of Cu, Zn, and TMO, for instance, $CuAl_2O_4$ and $ZnAl_2O_4$ spinel phases. To provide reactivity at 850° C. firing temperature, a suitable liquid phase must be established. This liquid phase will partially dissolve the Cu, Zn, and TMO and transport them to the conductor/alumina interface for reaction. The liquid phase will also physically draw these other oxides from the conductor region to this interface by liquid capillary forces during the firing step. In both cases, the $Al_2O_3$ from the substrate is allowed to form reaction products with the reactive components of the binder.

The liquid phase described above can be in the form of a suitable glass frit in the paste. It can also be in the form of bismuth oxide. In the best case, it is a combination of bismuth oxide and lead oxide, with optional glass frit additions.

Bismuth oxide and lead oxide form a lower melting eutectic-type composition at 73 mole % PbO/27% $Bi_2O_3$. The melting temperature is 635° C. (R. M. Biefeld and S. S. White, *J. Am. Ceram. Soc.*, Vol. 64, No. 3, pp. 182-184, 1981). Additional lower melting compositions exist between the binaries $Bi_2O_3$ and CuO, PbO and CuO, $Bi_2O_3$ and ZnO, PbO and ZnO, etc. Thus, the $Bi_2O_3 + PbO$ create the basis for the liquid phase. Note that just $Bi_2O_3$ can be the basis for the liquid phase since its melting point is approximately 825° C., and since it can form lower melting point liquids with CuO and ZnO and $Fe_2O_3$. However, it is more effective when used together with PbO. As shown by Example 29 below, it is necessary to have $Bi_2O_3$ and/or PbO present in order to provide an adequately mobile liquid phase (flux) during firing. On the other hand, if the amount of fluxing materials is significantly greater than 5% of the electrically conductive metal, the solderability may be degraded.

Optionally, the liquid phase can be in the form of a low viscosity glass. Typically, the glass is based on borates, silicates, or borosilicates of lead and/or bismuth. Hence, the liquid phase chemistry is similar to the above mixture of bismuth oxide and lead oxide, with the addition of $B_2O_3$ and/or $SiO_2$ to the liquid. The reactive cations (Zn, Cu, and/or TMO) could be melted into the glass beforehand, or react with the glass during the firing step. Of course, such a glass can be used in conjunction with $Bi_2O_3$ or its precursors, or PbO or its precursors, or both. It has been found experimentally, however, that $Bi_2O_3$ and PbO together are the more effective form since high levels of $B_2O_3$ and/or $SiO_2$ in the composition interfere with solderability and solder leach resistance. Small glass additions to ($Bi_2O_3$+PbO) are also effective.

To obtain the full benefit of multiple oxide additions, proper particle size control of the oxides must be exercised. Very coarse inorganic binder particles will have difficulty in reacting with each other because of limited amount of contact and reduced surface area for reaction and dissolution. Generally, it is preferable that the binder particles be less than 10 microns in size, and especially it is better if the binder particles are mostly below three microns.

Instead of separately adding the oxide species to the paste formulation, some or all can be reacted or melted together to form a lower melting phase. The resulting material is then added to the paste formulation. This melted phase can be in the form of a borate, silicate, or borosilicate glass as described above, or simply in the form of some or all of the constituent oxides calcined or melted together with no other additions. Suitable particle size control would again have to be maintained, and if the materials are melted together, they should be milled to an appropriate size, typically under 10 microns. One advantage of separately adding the oxide species is that the raw materials are more conveniently available as separate oxides, which precludes the need for a separate melting or calcining steps. However, some or all of the oxide additions could still be combined to form lower melting point, reactive oxide binder phases, if desired. It is not necessary to add the inorganic binder as separate, individual oxides.

Another way to introduce the oxides in the current invention is to coprecipitate some or all of them from solution. This technique ensures an intimate, uniform dispersion of the inorganic binder phase. Another technique similar to coprecipitation is spray atomization where a precursor solution of the oxides is atomized to a fine mist, then the liquid is evaporated from the droplets in the mist to leave uniform particles that contain the binder phase. A calcining (heat treatment) step at about 300°–600° C. is preferably carried out after coprecipitation or spray atomization to ensure powder homogeniety and complete conversion to the oxide phase from any possible precursor phase. Such a heat treatment step is not, however, essential.

The reactive part of the binder system is based on CuO, ZnO, and TMO, and/or their suitable precursors. Together they are key for developing good aged adhesion. Each of these oxides alone can be used separately somewhat to improve aged adhesion; however, a practical high silver formulation (e.g., less than 2% alloy addition by weight relative to Ag) cannot be made with just one of these additions. Too high a level is required to develop satisfactory aged adhesion with only a single reactive oxide addition and solderability and solder leach resistance are severely degraded. However, by using appropriate combinations of the three components, the total amount can be minimized, and good overall properties can be obtained.

Aged Adhesion

One performance criterion of a thick film conductor is its long term adhesion after elevated temperature aging at 150° C. Although there is no generally accepted value which defines acceptable performance, for most applications 18 newtons after 1000+ hours of aging at 150° C. is quite acceptable.

Aged adhesion of soldered joints depends on two main factors: the time for Sn in the solder to react with the conductor and reach the conductor/substrate interface; and the residual bond strength after the Sn reaches said interface. The bond strength is found to depend on the presence of the reactive components CuO/ZnO/TMO or their suitable precursors. Good aged adhesion, then, depends on the formation of reactive compounds between the substrate and these oxides.

When no reactive compounds are present, the bond between the conductor and substrate is very rich in bismuth oxide, and chemical degradation can occur according to the reaction, $$3Sn + 2Bi_2O_3 = 4Bi + 3SnO_2 \tag{1}$$

In other words, bismuth oxide is an effective flux for thick film conductors since is provides a liquid phase during firing. Bismuth oxide is also well known in the art for providing good conductor solderability in the fired state. However, interfacial bonds between the conductor and the substrate that are based exclusively on $Bi_2O_3$ would be expected to degrade according to Reaction (1). Thus, the formation of more durable compounds with the substrate is essential to maintain high aged adhesion after complete Sn penetration of the conductor.

As described above, the choice of the three oxides, coupled with the $Bi_2O_3$/PbO flux system, allows for aged adhesion to be developed with a minimum of overall inorganic binder. This technique has obvious advantages in solderability and solder leach resistance, and allows for high thermal cycled adhesion, especially when used with high silver content compositions. However, it can also be used with standard 3/1, 6/1, etc., Ag/Pd type compositions, provided that higher overall inorganic binder levels are used. Also, the CuO/ZnO/TMO would require additions of a suitable glass when used in a higher Pd-content conductor such as a 3/1 Ag/Pd.

In the event it is desired still further to augment the aged adhesion (AA) of the compositions of the invention, up to 5% by weight of a pyrochlore-related compound may be added. It is preferred to use at least 0.1% in order to get any technical effect, but no more than 5% since such higher amounts of the material may adversely affect TCA. It is therefore preferred to use no more than 2% by weight of such pyrochlores.

The pyrochlore-related oxides which can be used in the invention are those corresponding to the formula $(M_xM'_{2-x})M''_2O_{7-z}$, wherein M is different than M' and is selected from at least one of Pb, Bi, Cd, Cu, Ir, Ag, Y, rare earth metals having atomic numbers of 57–71 and mixtures thereof, M' is selected from Pb, Bi and mixtures thereof, M'' is selected from Ru, Ir, Rn, and mixtures thereof, $x = 0$–0.5, and $z = 0$–1.

Those pyrochlore-related oxides in which M is Cu, M' is Bi and M'' is Ru are particularly preferred. Of these the compound $Cu_{0.5}Bi_{1.5}Ru_2O_{6.75}$ has been found to be particularly effective.

Materials of this type are well-known in the thick film resistor art and can readily be made by the processes disclosed in U.S. Pat. No. 3,583,931 to Bouchard and U.S. Pat. No. 4,420,422 to Ferretti.

Thermal Cycled Adhesion

Thermal cycled adhesion failures can occur in various locations of the soldered assembly. For instance, conductor/substrate separation ("A" mode), solder/conductor cracking ("B" mode), wire/solder separation for wire peel tests ("C" mode), and cracking or divoting in the alumina substrate under the soldered conductor pad ("D" mode). The best way to avoid all of the failures from the perspective of the conductor is described below.

A-mode failures require a high bond strength between the conductor and substrate. This feature is similar to high long term aged adhesion. However, it is especially useful if the Sn can be delayed in reaching this interface during thermal cycling. Hence, the conductor should act as a barrier layer for Sn diffusion through and reaction with the conductor, delaying the time it takes for the Sn to reach the conductor/substrate interface. Pure silver is a very good barrier to Sn diffusion. Silver with small levels of precious metal additions is not as effective as pure silver, but can still significantly delay the arrival of Sn to the substrate interface. For instance, Pt/Ag compositions of approximately 1/100 can take 100-500 hours of aging at 150° C. before the conductor/substrate interface is saturated with Sn. On the other hand, higher Pd/Ag conductors, for instance approximately 5-10% or more Pd relative to Ag, take as little as 10-40 hours for Sn to reach the substrate/conductor interface at 150° C.

Thus, the technique for formulating high silver compositions is particularly useful for improving thermal cycled adhesion relative to traditional Pd/Ag compositions since the technique allows for stable long term aged adhesion plus excellent solderability and solder leach resistance with a metallurgy that is superior for thermal cycled adhesion.

Other types of thermal cycle adhesion failures can occur in the solder fillet. Cracking along the conductor/solder interface is influenced by the formation of weakened, Pb-rich regions as Sn from the solder reacts with the conductor to form intermetallic compounds. Reducing the rate of Sn reaction will minimize the changes at the conductor/solder interface, reducing the rate of cracking. Again, dense, Ag-rich compositions are useful to reduce the tendency for cracking during thermal cycling.

Another failure of significance is cracking in the ceramic substrate beneath the soldered conductor. This failure mode involves cracking into the alumina substrate, and is sometimes referred to as "D-mode" failure in the industry. The conductor fluxes $Bi_2O_3$ and PbO have both been shown to reduce the strength of alumina substrates (see FIG. 1.). These fluxes penetrate the substrate along the alumina grains during firing of thick film conductors, causing intergranular weakening. Thus, this technique for formulating thick film conductors can improve the tendency for substrates to divot and crack during thermal cycling because a low level of inorganic binder is used, minimizing the weakening along the alumina grains and so reducing the extent of substrate divoting and cracking.

Thermal Cycle Reliability of Mounted Components

The wire peel performance of a soldered conductor pad after thermal cycling is only one measure of reliability of a conductor. Circuit manufacturers are also concerned about the reliability of actual soldered components. For instance, electrical failures due to solder joint cracking have been reported (N. T. Panousis, R. C. Kershner, *IEEE Proc. Electron Components Conf.* 31st, Atlanta Ga., May 11-13, 1981, pp. 165-171; also K. Yamamoto, M. Moriyama, and S. Uchida, *Proc. International Symposium on Microelectronics*, Chicago Ill., Oct. 15-17, 1990, pp. 610-617).

The disclosed method of formulating conductors for improved thermal cycled adhesion is expected to also provide improved reliability of components soldered to a substrate. When mounted (soldered) components are thermally cycled, the range of failure modes A, B and D discussed with wire peel geometries can still occur. For instance, if Sn penetrates the fired conductor layer, the conductor/substrate bond can be disrupted, with cracks occuring at that interface. These A-mode cracks could in principle occur under the bond pad of a mounted and soldered component as well as under a soldered wire. Also, cracks can occur at the solder/conductor interface of a solder joint attaching a mounted component to a substrate as well as in a solder joint attaching a test wire to the substrate.

In addition to the traditional A through D failure modes, at least one other failure mode can occur with mounted components that are thermally cycled. Vertical cracks through a conventional Pd/Ag conductor were reported by Yamamoto et al. These occurred because Sn from the solder rapidly penetrated the conductor during the high temperature part of the thermal cycle profile. The thermal expansion mismatch between the Sn consumed conductor region and adjacent unsoldered conductor tracks lead to the cracking. The use of high Ag conductor metallurgies leads to much slower Sn penetration, as is well known in the industry. Thus, high density, Ag-rich conductor compositions will resist Sn diffusion during thermal cycle excursions, reducing or eliminating the problem with cracks that can occur through the conductor layer. An important characteristic of the invention is that this ability to block Sn diffusion can now be coupled with good long term aged adhesion. For further background, see B. E. Taylor, J. J. Felten and J. R. Larry, *IEEE Proc. Electronic Components Conference*, Apr. 28-30, 1980, San Francisco, Calif.; and C. R. S. Needes and J. P. Brown, *Proc. International Society of Hybrid Microelectronics*, Oct. 24-26, 1989, Baltimore, Md., pp. 211-219.

Solderability, Solder Leach Resistance

One advantage of higher Pd-containing compositions is their tendency to resist leaching during the soldering step. As described above, pure silver compositions can have excellent thermal cycled adhesion, but they suffer from a loss in solder leach resistance. However, acceptable performance can be obtained with lower levels of platinum.

TABLE 1

| Effect of Conductor Composition On Solder Leach Resistance | | | |
|---|---|---|---|
| Pt/Ag (by Wt.) | 0/100 | 0.6/99.4 | 1.2/98.8 |
| Solder Leach Resistance | 2 | 4 | 6 |

These results are with typical paste formulations. A pure fritless silver layer that contains no glass or oxides whatsoever actually has good solder leach resistance—approximately 6 dips. So the solderability and solder leach resistance can be degraded by the addition of glass and oxide compounds. Thus, formulating pure Ag or nearly pure Ag metallurgies adds significant complications in obtaining good solderability and solder leach resistance unless low levels of inorganic binder are used. The invention is particularly useful in these cases since good aged adhesion can be obtained without sacrificing solderability and solder leach resistance.

Silver Migration Resistance

Besides affording improved solder leach resistance, palladium is well known for improving the migration tendency of silver. The classical test for this characteristic is to establish a voltage between two adjacent conductor lines, and measure the time it takes for dendrites of the conductive phase to grow across the gap between the two lines, shorting out the two lines. This test is typically run under moisture, or even with a droplet of water bridging the two conductor lines. Traditionally, higher Pd additions have been made to Ag conductors (e.g., 3/1 Ag/Pd) to afford high silver migration resistance.

Typically, as Pd is added to Ag thick film pastes, better silver migration resistance and solder leach resistance are obtained, but at the expense of thermal cycled adhesion. Silver migration resistance can be designed into a circuit, though, with the use of glass encapsulants separating the conductor lines. Silicone based encapsulants are also well known in the art. Also, hermetic packages can be designed using cans that are soldered to the circuit which prevent moisture from reaching the circuit.

Organic Medium

The inorganic particles are mixed with an essentially inert liquid medium (vehicle) by mechanical mixing (e.g., on a roll mill) to form a paste-like composition having suitable consistency and rheology for screen printing. The latter is printed as a "thick film" on conventional dielectric substrates in the conventional manner.

Any inert liquid may be used as the vehicle. Various organic liquids, with or without thickening and/or stabilizing agents and/or other common additives, may be used as the vehicle. Exemplary of organic liquids which can be used are the aliphatic alcohols, esters of such alcohols, for example, acetates and propionates, terpenes such as pine oil, terpineol and the like, solutions of resins such as the polymethacrylates of lower alcohols and solutions of ethyl cellulose in solvents such as pine oil and the monobutyl ether of ethylene glycol monoacetate. A preferred vehicle is based on ethyl cellulose and beta-terpineol. The vehicle may contain volatile liquids to promote fast setting after application to the substrate.

The ratio of vehicle to solids in the dispersions can vary considerably and depends upon the manner in which the dispersion is to be applied and the kind of vehicle used. Normally to achieve good coverage, the dispersions will contain complementally 60-90% solids and 40-10% vehicle. The compositions of the present invention may, of course, by modified by the addition of other materials which do not affect its beneficial characteristics. Such formulation is well within the skill of the art.

The pastes are conveniently prepared on a three-roll mill. The viscosity of the pastes is typically within the following ranges when measured on a Brookfield HBT viscometer at low, moderate and high shear rates:

| Shear Rate (sec$^{-1}$) | Viscosity (Pa.s) | |
|---|---|---|
| 0.2 | 100-5000 | |
| | 300-2000 | Preferred |
| | 600-1500 | Most Preferred |
| 4 | 40-400 | |
| | 100-250 | Preferred |
| | 140-200 | Most Preferred |
| 40 | 10-150 | |
| | 25-120 | Preferred |
| | 50-100 | Most Preferred |

The amount of vehicle utilized is determined by the final desired formulation viscosity.

Formulation and Application

In the preparation of the compositions of the present invention, the particulate inorganic solids are mixed with the organic medium and dispersed with suitable equipment, such as a three-mill, to form a suspension, resulting in a composition for which the viscosity will be in the range of about 100-200 pascal-seconds at a shear rate of 4 sec$^{-1}$.

In the examples which follow, the formulation was carried out in the following manner:

The ingredients of the paste, minus about 5% organic components equivalent to about 5% wt., are weighed together in a container. The components are then vigorously mixed to form a uniform blend; then the blend is passed through dispersing equipment, such as a three-roll mill, to achieve a good dispersion of particles. A Hegman gauge is used to determine the state of dispersion of the particles in the paste. This instrument consists of a channel in a block of steel that is 25 $\mu$m deep (1 mil) on one end and ramps up to 0" depth at the other end. A blade is used to draw down paste along the length of the channel. Scratches will appear in the channel where the agglomerates' diameter is greater than the channel depth. A satisfactory dispersion will give a fourth scratch point of 10-18 typically. The point at which half of the channel is uncovered with a well dispersed paste is between 3 and 8 typically. Fourth scratch measurement of >20 $\mu$m and "half-channel" measurements of >10 $\mu$m indicate a poorly dispersed suspension.

The remaining 5% consisting of organic components of the paste is then added, and the resin content is adjusted to bring the viscosity when fully formulated to between 100 and 200 Pa.s at a shear rate of 4 sec$^{-1}$. The composition is then applied to a substrate, such as alumina ceramic, usually by the process of screen printing, to a wet thickness of about 30-80 microns, preferably 35-70 microns, and most preferably 40-50 microns. The electrode compositions of this invention can be printed onto the substrates either by using an automatic printer or a hand printer in the conventional manner, preferably automatic screen stencil techniques are employed using a 200-to 325-mesh screen. The printed pattern is then dried at below 200° C., about 150° C., for about 5-15 minutes before firing. Firing to effect sintering of both the inorganic binder and the finely divided particles of metal is perferably done in a well ventilated belt conveyor furnace with a temperature profile that will allow burnout of the organic matter at about 300°-600° C., a period of maximum temperature of about 800°-1000° C. lasting about 5-15 minutes, followed by a controlled cooldown cycle to prevent over sintering, unwanted chemical reactions at intermediate temperatures or substrate fracture which can occur from too rapid cooldown. The overall firing procedure will preferably extend over a period of about 1 hour, with 20-25 minutes to reach the firing temperature, about 10 minutes at the firing temperature and about 20-25 minutes in cooldown. In some instances, total cycle times can be used as short as 20-30 minutes by conventional firing and 7-14 minutes of infrared firing.

Test Procedures

Solderability: The solderability tests were performed as follows: The fired parts were dipped in a mildly active rosin flux such as Alpha 611, then heated for 3 seconds by dipping the edge of the ceramic chip in the molten solder. The chip was then submerged in the solder for 10 seconds, withdrawn, cleaned and inspected. Solderability was determined by the percentage of solder coverage (buildup) obtained on the thick film test pattern.

Solder leach resistance—the tests were performed as follows: The fired parts were dipped in a mildly active flux such as Alpha 611, then heated for 5 seconds by dipping the edge of the ceramic chip in the molten solder. The chip was then submerged in the solder for 10 seconds, then withdrawn, cleaned, and inspected. Failure was determined by the number of dips necessary to cause a break in a 20 mil wide serpentine conductor line.

Other solder fluxes such as nonactivated rosin® fluxes and rosin activated (RA) fluxes could also be used for these conductor compositions. However, particular care has to be taken in cleaning residual RA flux from the circuit after the soldering step.

The adhesion was measured using an "Instron" pull tester in a 90° peel configuration at a pull rate of 0.5 inch per minute. Twenty gauge pre-tinned wires were attached to 80 mil×80 mil pads by solder dipping for 10 seconds in 62 Sn/36 Pb/2 Ag solder at 220° C. or in 63 Sn/37 Pb solder at 230° C. using Alpha 611 flux.

Adhesion: The adhesion was measured using an "Instron" pull tester in a 90° peel configuration at a pull rate of 2 inches per minute. Twenty gauge pre-tinned wires were attached to 80 mil×80 mil pads by solder dipping for 10 seconds in 62 Sn/36 Pb/2 Ag solder at 220° C. or in 63 Sn/37 Pb solder at 230° C. using Alpha 611 flux. (Alpha 611 is a tradename for solder flux made by Alpha Metals Inc., Jersey City, N.J.) Aging studies were carried out in air in a Blue M Stabil-Therm® oven controlled at 150° C. After aging, test parts were allowed to equilibrate several hours in air before the wires were pulled. A peel force of at least 15 newtons after 1000 hours aging at 150° C. is considered to be essential for most applications.

Figure 2:
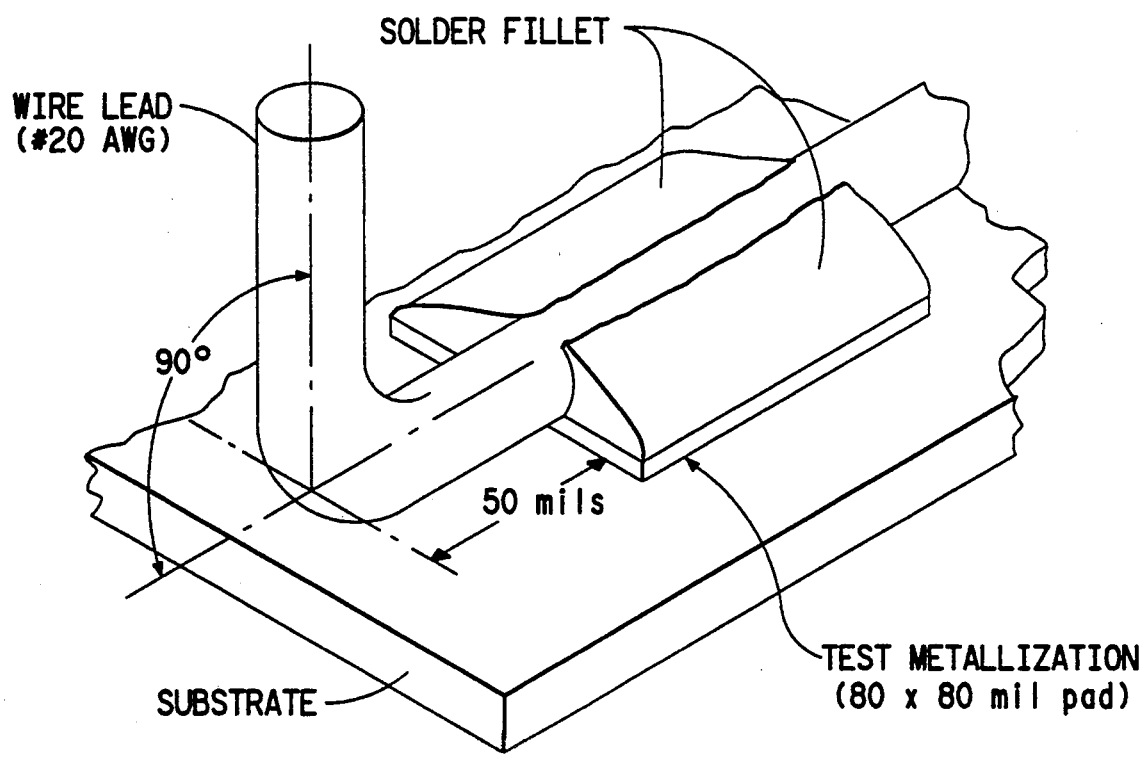
FIG. 2 is a drawing of the adhesion test bond configuration.

The standard configuration of the Du Pont "peel" adhesion test is shown in FIG. 2. Solder joint failures can be characterized as follows:
Type A: Conductor/substrate interface failure (pad lift-off);
Type B: Conductor/solder failure;
Type C: Wire pull out from solder; and
Type D: Substrate failure (divoting).

Thermal Cycled Adhesion (TCA): The TCA test employs the same adhesion (peel) test described above. However, instead of measuring adhesion after isothermal aging at 150° C., the sample is tested after thermal cycling between two temperatures.

Thermal cycle test conditions such as ΔT, transition rate, film thickness, solder joint design, etc., must be carefully selected in order to accurately predict performance under actual service conditions. For example, extreme thermal shock conditions (large ΔT and transition time ≦2 minutes) can cause brittle fracture of the alumina substrate which may not accurately represent the type of failures observed under actual use conditions (e.g., automotive engine compartment). Likewise, cycling of soldered thick films through large ΔTs often results in failure due to fatigue cracking through the solder joint. Therefore the rate of transition and the temperature extremes on thermal cycling must be controlled to ensure that failure modes in accelerated tests are the same as those observed in the field. FEM analysis of stresses in various solder joint designs subjected to thermal cycling can be helpful in understanding observed failure modes under various processing and testing conditions.

Two types of thermal cycle equipment are generally used which differ in the transition rate between temperature extremes.

In single chamber equipment, the test assembly is placed in a single chamber and the heating and cooling cycles are carried out alternately in that chamber. In a dual chamber apparatus, one chamber is heated, the other is cooled, and the test assembly is transferred between them to obtain the temperature cycles. A suitable single chamber device is the VR CO8-PJ-3WG model made by Blue M Corporation, Blue Island, Ill. A suitable dual chamber device is the model ATS-320 made by Themotron, North Holland, Mich.

Figure 3A:
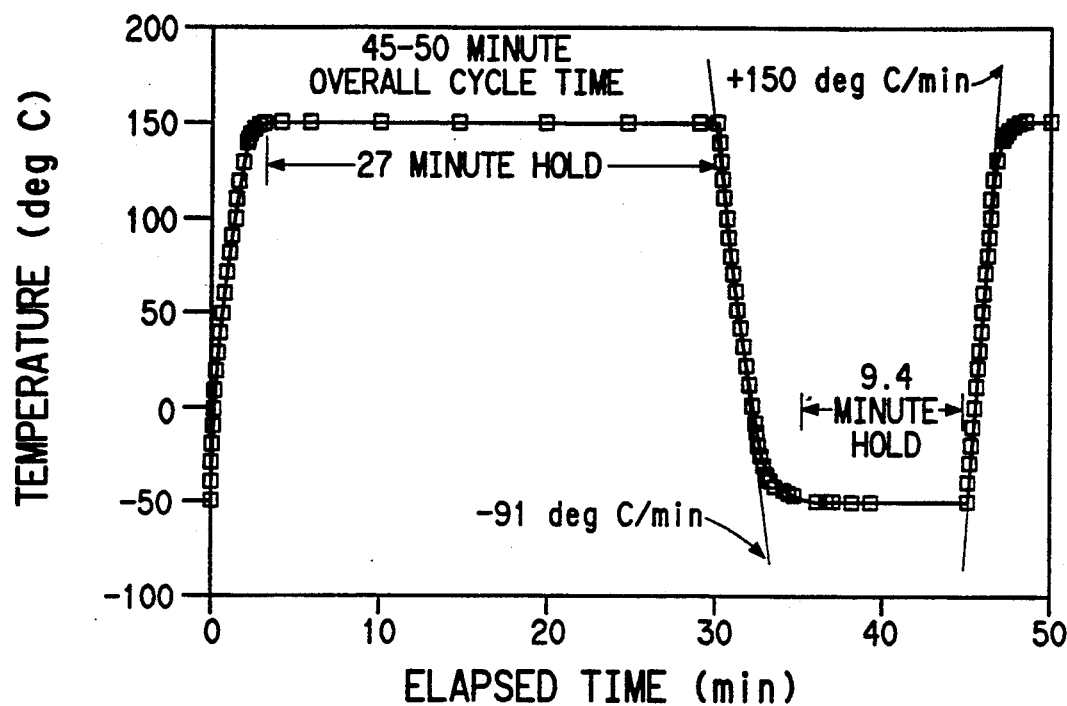
FIG. 3a is a graphical representation of the temperature/time profile for the Two-chamber thermal cycle adhesion test.
Figure 3B:
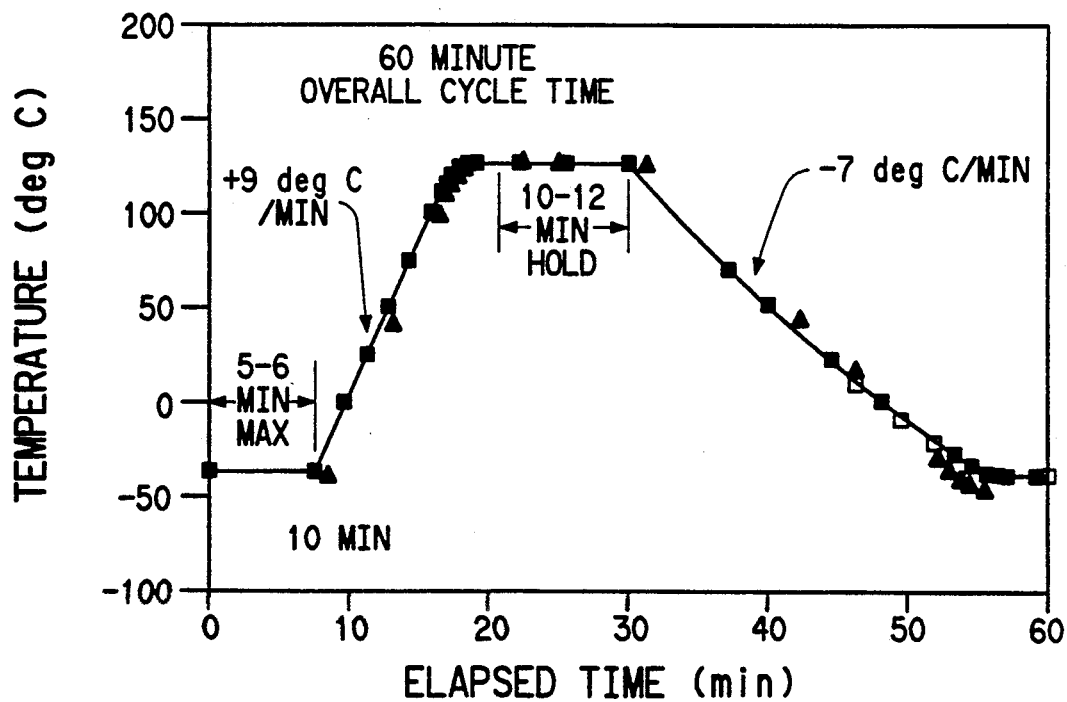
FIG. 3b is a graphical representation of the temperature/time profile for the Single-chamber thermal cycle adhesion test.

The transition rate of the single chamber units is determined by the size of the refrigeration unit, thermal mass of the chamber plus load and the ΔT range. FIGS. 3a and 3b show typical thermal cycle profiles that were obtained with the Blue M and Thermotron equipment used to generate the data given herein. Two standard ΔT profiles were used:
−40° to +125° C. (FIG. 3a)
−50° to +150° C. (FIG. 3b)
Because the Thermotron® dual-chamber unit consists of hot and cold chambers maintained at the desired temperature extremes and the test samples cycle rapidly between the hot and cold chambers, the transition rate between temperature extremes is much more rapid than in the single chamber equipment.

EXAMPLES

In the following examples, the thick film conductive pastes were prepared by mixing together the dry solids ingredients, adding the dry solids admixture to the organic medium and three-roll milling the solids and organic medium to effect complete dispersion of the solids in the medium. In some instances, one or more metal oxides were added to already-formed pastes to form the complete composition. Each of the pastes was then screen printed onto a 96% alumina substrate and fired twice at 850° C. using a 30 minute long cycle with 10 minutes at the peak temperature.

EXAMPLES 1-4

Three commercially available silver-based conductive thick film pastes were used to prepare a series of four tests directed at observing the effect of the conductive metal on the solder leach resistance, aged adhesion (AA) and thermal cycle adhesion (TCA) of such layers when they are fired on alumina substrates. The composition of the conductive phases and the properties of the fired layers are given in Table 2 below.

TABLE 2

Adhesion Properties of Commercial Conductive Thick Film Pastes

| | Example No. | | | |
|---|---|---|---|---|
| | 1 | 2 | 3 | 4 |
| Conductive Metal Composition (wt.) | 33/67 Pd/Ag | 100 Ag | 100 Ag | 1/100 Pt/Ag |
| Product Name | Du Pont 7484 | Du Pont 6160 | Du Pont 6160 | Du Pont QS170 |
| Fired Layer Properties | | | | |
| Pad Thickness | 12 μm | 11.5 μm | 18 μm | 10 μm |
| Solderability | 95-100% | 95-100% | 95-100% | 95-100% |
| Solder Leach Resistance | 7-8 dips | 3 dips | 4 dips | 5-6 dips |
| Aged adhesion, 1000 h, 150° C. Kyocera 96% alumina substrates | 25 N | 4 N | 20 N | 23 N |
| Aged adhesion, 2000 h, 150° C. Kyocera 96% alumina substrates | 24 N | 5 N | 5 N | 23 N |
| TCA, 240 Cycles, -50/150° C. Coors 96% alumina substrates | <10 N | 25 N | 28 N | 12 N |
| TCA, 500 Cycles, -50/150° C. Coors 96% alumina substrates | <5 N | 14 N | 21 N | <5 N |
| TCA, 1000 Cycles, -40/125° C. Kyocera 96% alumina substrates | 25 N | 32 N | 31 N | 18 N |
| TCA, 1500 Cycles, -40/125° C. Kyocera 96% alumina substrates | 18 N | 25 N | 27 N | 8 N |
| TCA, 2000 Cycles, -40/125° C. Kyocera 96% alumina substrates | 11 N | 19 N | 22 N | <5 N |

With the current state of the art, it is difficult to formulate thick film conductors with outstanding thermal cycled adhesion (TCA) and high long term aged adhesion. The reason is because the binder modifications that develop high aged adhesion degrade the fired film density and microstructure, causing a decrease in thermal cycled adhesion and solderability.

Traditionally, silver compositions with relatively large Pd alloy additions have been employed for automotive applications. A 3/1 Ag/Pd ratio paste is shown in Example 1, where high aged adhesion through 2000 hours, and good thermal cycled adhesion through 1500 cycles at −40°/125° C., is reported. The thermal cycled adhesion under sever shock conditions (−50°/150° C. (FIG. 1)) was severly degraded, however.

Improvements in TCA have been observed with a pure silver composition, Examples 2 and 3. Here, the TCA was excellent under a variety of cycle and shock profiles; however, aged adhesion was not as good as the traditional Pd/Ag composition, though the print thickness of the silver paste can be adjusted to afford good aged adhesion over the required lifetime.

High long term aged adhesion can be achieved in nearly pure silver compositions, as shown in Example 4. In this case, thicker conductor prints were not necessary to develop stable long term aged adhesion. However, the art of developing compositions having high aged adhesion at 10-12 micron pad thickness has lead to reductions in thermal cycled adhesion vs. the pure silver composition (compare Example 4 with Examples 2 and 3).

EXAMPLES 5-35

A series of 31 conductive thick film pastes was prepared using four different silver powders having the properties indicated in Table 3. These silver powders were then combined with the five glass frit compositions having the compositions indicated in Table 4. Using these materials, a series of conductive thick film pastes was formulated in which the effect of various compositional variables could be observed. The composition of the pastes is given in Table 5 below.

TABLE 3

| | Silver Powder Properties | | | |
|---|---|---|---|---|
| | A | B | C | D |
| Surface Area[1] [m2/g] | 0.9 | 3 | 1.5 | 1.2 |
| Tap Density[2] [g/cc] | >3.0 | 2.2 | 3.1 | 1 |
| d90[3] | 6.3 | 2.6 | <5 | 9 |
| Morphology | Flake | Uniaxed[4] | Uniaxed[4] | Uniaxed[4] |

[1]Surface area by B.E.T. Quantachrome Monosorb
[2]Tap Density by Tap-Pak Volumeter, ASTM B527-85
[3]Particle Size Distribution by Leeds & Northrup Microtrac
[4]Precipitated non-flake particles.

TABLE 4

| | Conductor Glass Frit Compositions | | | | |
|---|---|---|---|---|---|
| | E | F | G | H | I |
| $Bi_2O_3$ | 50.5 | 60 | 75.1 | 43.6 | |
| PbO | 42.4 | 37 | 10.9 | 56.4 | 80.6 |
| $B_2O_3$ | 3.6 | 3 | 1.2 | | 12.0 |
| $SiO_2$ | 3.5 | | 9.3 | | 6.0 |
| $Al_2O_3$ | | | 1.1 | | |
| ZnO | | | | | 1.4 |
| CaO | | | 2.4 | | |

A pattern of each of the above referred pastes was then screen printed onto a 96% alumina substrate and fired in the manner described hereinabove. The thickness of each of the fired layers was measured and the fired layer pattern was tested with respect to solderability, solder leach resistance, aged adhesion and thermal cycle adhesion. The composition of each of the pastes is given in Table 5 and the properties of each of the fired layers are given in Table 6.

In the following examples, $Cu_2O$, $PbO_2$ and $MnO_2$ were used in the formulation as precursors for CuO, PbO and MnO, respectively.

TABLE 5

Experimental Paste Formulations

| | Example No. | | | | | | | |
|---|---|---|---|---|---|---|---|---|
| | 5 | 6 | 7 | 8 | 9 | 10 | 11 | 12 |
| Pt/Ag | 0.0048 | 0.0048 | 0.0048 | 0.0048 | 0.0048 | 0.0048 | 0.0048 | 0.0048 |
| Pd/Ag | 0 | 0 | 0 | 0 | 0 | 0 | 0 | 0 |
| (Copper-bismuth ruthenate)/Ag | 0 | 0 | 0 | 0 | 0 | 0 | 0 | 0 |
| Ag Powder Type | A | A | A | A | A | A | A | A |
| $CuO/(Bi_2O_3 + PbO)$ | 0.22 | 0.4 | 0.4 | 0.4 | 0.4 | 0.4 | 0.4 | 0.4 |
| $ZnO/(Bi_2O_3 + PbO)$ | 0 | 0 | 0.26 | 0.27 | 0.26 | 0.26 | 0.26 | 0.26 |
| $Fe_2O_3/(Bi_2O_3 + PbO)$ | 0 | 0.34 | 0 | 0.34 | 0.31 | 0 | 0 | 0.34 |
| $NiO/(Bi_2O_3 + PbO)$ | 0 | 0 | 0 | 0 | 0 | 0.31 | 0 | 0.23 |
| $Co_3O_4/(Bi_2O_3 + PbO)$ | 0 | 0 | 0 | 0 | 0 | 0 | 0.31 | 0 |
| $MnO/(Bi_2O_3 + PbO)$ | 0 | 0 | 0 | 0 | 0 | 0 | 0 | 0 |
| $MgO/(Bi_2O_3 + PbO)$ | 0 | 0 | 0 | 0 | 0 | 0 | 0 | 0 |
| $TiO_2/(Bi_2O_3 + PbO)$ | 0 | 0 | 0 | 0 | 0 | 0 | 0 | 0 |
| $Y_2O_3/(Bi_2O_3 + PbO)$ | 0 | 0 | 0 | 0 | 0 | 0 | 0 | 0 |
| $Cr_2O_3/(Bi_2O_3 + PbO)$ | 0 | 0 | 0 | 0 | 0 | 0 | 0 | 0 |
| $ZrO_2/(Bi_2O_3 + PbO)$ | 0 | 0 | 0 | 0 | 0 | 0 | 0 | 0 |
| $PbO/(Bi_2O_3 + PbO)$ | 0.2 | 0.23 | 0.29 | 0.22 | 0.22 | 0.29 | 0.29 | 0.29 |
| Frit/(Frit + added $Bi_2O_3$ + added PbO) | 0 | 0 | 0.18 | 0 | 0.18 | 0.18 | 0.18 | 0.18 |
| Frit Type | — | — | E | — | E | E | E | E |
| (Total inorganic binder)/Ag | 0.012 | 0.013 | 0.013 | 0.015 | 0.015 | 0.015 | 0.015 | 0.017 |
| Form of binder particles | Admixed | Admixed | Admixed | Admixed | Admixed | Admixed | Admixed | Admixed |

| | Example No. | | | | | | | |
|---|---|---|---|---|---|---|---|---|
| | 13 | 14 | 15 | 16 | 17 | 18 | 19 | 20 |
| Pt/Ag | 0.0048 | 0.0048 | 0.0048 | 0.0048 | 0.0048 | 0.0048 | 0.0048 | 0.0048 |
| Pd/Ag | 0 | 0 | 0 | 0 | 0 | 0 | 0 | 0 |
| (Copper-bismuth ruthenate)/Ag | 0 | 0 | 0 | 0 | 0 | 0 | 0 | 0 |
| Ag Powder Type | A | A | A | A | A | A | A | A |
| $CuO/(Bi_2O_3 + PbO)$ | 0.4 | 0.4 | 0.4 | 0.4 | 0.4 | 0.4 | 0.4 | 0.4 |
| $ZnO/(Bi_2O_3 + PbO)$ | 0.26 | 0.26 | 0.26 | 0.26 | 0.26 | 0.26 | 0.26 | 0.31 |
| $Fe_2O_3/(Bi_2O_3 + PbO)$ | 0.34 | 0 | 0 | 0 | 0 | 0 | 0 | 0.34 |
| $NiO/(Bi_2O_3 + PbO)$ | 0 | 0 | 0 | 0 | 0 | 0 | 0 | 0 |
| $Co_3O_4/(Bi_2O_3 + PbO)$ | 0.23 | 0 | 0 | 0 | 0 | 0 | 0 | 0 |
| $MnO/(Bi_2O_3 + PbO)$ | 0 | 0.15 | 0 | 0 | 0 | 0 | 0 | 0 |
| $MgO/(Bi_2O_3 + PbO)$ | 0 | 0 | 0.15 | 0 | 0 | 0 | 0 | 0 |
| $TiO_2/(Bi_2O_3 + PbO)$ | 0 | 0 | 0 | 0.15 | 0 | 0 | 0 | 0 |
| $Y_2O_3/(Bi_2O_3 + PbO)$ | 0 | 0 | 0 | 0 | 0.15 | 0 | 0 | 0 |
| $Cr_2O_3/(Bi_2O_3 + PbO)$ | 0 | 0 | 0 | 0 | 0 | 0.15 | 0 | 0 |
| $ZrO_2/(Bi_2O_3 + PbO)$ | 0 | 0 | 0 | 0 | 0 | 0 | 0.15 | 0 |
| $PbO/(Bi_2O_3 + PbO)$ | 0.29 | 0.29 | 0.29 | 0.29 | 0.29 | 0.29 | 0.29 | 0.22 |
| Frit/(Frit + added $Bi_2O_3$ + added PbO) | 0.18 | 0.18 | 0.18 | 0.18 | 0.18 | 0.18 | 0.18 | 0 |
| Frit Type | E | E | E | E | E | E | E | — |
| (Total inorganic binder)/Ag | 0.017 | 0.015 | 0.015 | 0.015 | 0.015 | 0.015 | 0.015 | 0.015 |
| Form of binder particles | Admixed | Admixed | Admixed | Admixed | Admixed | Admixed | Admixed | Admixed |

| | Example No. | | | | | | | |
|---|---|---|---|---|---|---|---|---|
| | 21 | 22 | 23 | 24 | 25 | 26 | 27 | 28 |
| Pt/Ag | 0 | 0.0048 | 0.0048 | 0.0048 | 0.0048 | 0.0048 | 0.0048 | 0.0048 |
| Pd/Ag | 0 | 0 | 0 | 0 | 0 | 0 | 0 | 0 |
| (Copper-bismuth ruthenate)/Ag | 0.0072 | 0 | 0 | 0 | 0 | 0 | 0 | 0 |
| Ag Powder Type | A | A | B | C | D | A | A | A |
| $CuO/(Bi_2O_3 + PbO)$ | 0.4 | 0.4 | 0.4 | 0.4 | 0.4 | 0.35 | 0.5 | 0.34 |
| $ZnO/(Bi_2O_3 + PbO)$ | 0.31 | 0.26 | 0.26 | 0.26 | 0.26 | 0.23 | 0.33 | 0.22 |
| $Fe_2O_3/(Bi_2O_3 + PbO)$ | 0.34 | 0.34 | 0.34 | 0.34 | 0.34 | 0.3 | 0.43 | 0.29 |
| $NiO/(Bi_2O_3 + PbO)$ | 0 | 0 | 0 | 0 | 0 | 0 | 0 | 0 |
| $Co_3O_4/(Bi_2O_3 + PbO)$ | 0 | 0 | 0 | 0 | 0 | 0 | 0 | 0 |
| $MnO/(Bi_2O_3 + PbO)$ | 0 | 0 | 0 | 0 | 0 | 0 | 0 | 0 |
| $MgO/(Bi_2O_3 + PbO)$ | 0 | 0 | 0 | 0 | 0 | 0 | 0 | 0 |
| $TiO_2/(Bi_2O_3 + PbO)$ | 0 | 0 | 0 | 0 | 0 | 0 | 0 | 0 |
| $Y_2O_3/(Bi_2O_3 + PbO)$ | 0 | 0 | 0 | 0 | 0 | 0 | 0 | 0 |
| $Cr_2O_3/(Bi_2O_3 + PbO)$ | 0 | 0 | 0 | 0 | 0 | 0 | 0 | 0 |
| $ZrO_2/(Bi_2O_3 + PbO)$ | 0 | 0 | 0 | 0 | 0 | 0 | 0 | 0 |
| $PbO/(Bi_2O_3 + PbO)$ | 0.22 | 0.22 | 0.22 | 0.22 | 0.22 | 0.39 | 0.13 | 0.55 |
| Frit/(Frit + added $Bi_2O_3$ + added PbO) | 0 | 0.18 | 0.18 | 0.18 | 0.18 | 0.16 + 0.84 | 1 | 0.16 + 0.84 |
| Frit Type | — | E | E | E | E | E + F | G | E + H |
| (Total inorganic binder)/Ag | 0.015 | 0.015 | 0.016 | 0.016 | 0.016 | 0.017 | 0.015 | 0.017 |
| Form of binder particles | Admixed | Coprecipitated | Admixed | Admixed | Admixed | Admixed | Admixed | Admixed |

| | Example No. | | | | | | |
|---|---|---|---|---|---|---|---|
| | 29 | 30 | 31 | 32 | 33 | 34 | 35 |
| Pt/Ag | 0.0048 | 0.0048 | 0.0048 | 0.0048 | 0.0048 | 0.0048 | 0.0048 |
| Pd/Ag | 0 | 0 | 0 | 0 | 0 | 0 | 0 |
| (Copper-bismuth ruthenate)/Ag | 0 | 0 | 0 | 0 | 0 | 0 | 0 |
| Ag Powder Type | A | A | A | A | A | A | A |

TABLE 5-continued

Experimental Paste Formulations

| | | | | | | | |
|---|---|---|---|---|---|---|---|
| CuO/(Bi$_2$O$_3$ + PbO) | No PbO or Bi$_2$O$_3$ | 0.43 | 0.34 | 0.45 | 0.37 | 0.42 | 0.46 |
| ZnO/(Bi$_2$O$_3$ + PbO) | No PbO or Bi$_2$O$_3$ | 0.28 | 0.22 | 0.3 | 0.25 | 0.28 | 0.3 |
| Fe$_2$O$_3$/(Bi$_2$O$_3$ + PbO) | No PbO or Bi$_2$O$_3$ | 0.37 | 0.29 | 0.38 | 0.32 | 0.36 | 0.39 |
| NiO/(Bi$_2$O$_3$ + PbO) | — | 0 | 0 | 0 | 0 | 0 | 0 |
| Co$_3$O$_4$/(Bi$_2$O$_3$ + PbO) | — | 0 | 0 | 0 | 0 | 0 | 0 |
| MnO/(Bi$_2$O$_3$ + PbO) | — | 0 | 0 | 0 | 0 | 0 | 0 |
| MgO/(Bi$_2$O$_3$ + PbO) | — | 0 | 0 | 0 | 0 | 0 | 0 |
| TiO$_2$/(Bi$_2$O$_3$ + PbO) | — | 0 | 0 | 0 | 0 | 0 | 0 |
| Y$_2$O$_3$/(Bi$_2$O$_3$ + PbO) | — | 0 | 0 | 0 | 0 | 0 | 0 |
| Cr$_2$O$_3$/(Bi$_2$O$_3$ + PbO) | — | 0 | 0 | 0 | 0 | 0 | 0 |
| ZrO$_2$/(Bi$_2$O$_3$ + PbO) | — | 0 | 0 | 0 | 0 | 0 | 0 |
| PbO/(Bi$_2$O$_3$ + PbO) | No PbO or Bi$_2$O$_3$ | 0 | 0.067 | 0.65 | 0.62 | 1 | 1 |
| Frit/(Frit + added Bi$_2$O$_3$ + added PbO) | 0 | 0 | 0.16 | 0 | 0.17 | 0.12 | 0 |
| Frit Type | — | — | E | — | E | I | — |
| (Total inorganic binder)/Ag | 0.0078 | 0.015 | 0.017 | 0.015 | 0.016 | 0.015 | 0.014 |
| Form of binder particles | Admixed | Admixed | Admixed | Admixed | Admixed | Admixed | Admixed |

TABLE 6

Experimental Data

| | Example No. | | | | | | | | | |
|---|---|---|---|---|---|---|---|---|---|---|
| | 5 | 6 | 7 | 8 | 9 | 10 | 11 | 12 | 13 | 14 |
| Pad Thickness | 11 μm | 10 μm | 9.5 μm | 11.5 μm | 9.5 μm | 9.5 μm | 9.5 μm | 9.5 μm | 9.5 μm | 9.5 μm |
| Solderability | 95–100% | 95–100% | 95–100% | 95–100% | 95–100% | 95–100% | 95–100% | 95–100% | 95–100% | 95–100% |
| Solder Leach Resistance | 5 dips | 5 dips | 4 dips | 5 dips | 4 dips | 4 dips | 4 dips | 4 dips | 4 dips | 4 dips |
| Aged adhesion, 120 h, 170° C. Kyocera 96% alumina substrates | — | — | — | — | — | — | — | 20 N | 22 N | — |
| Aged adhesion, 240 h, 170° C. Kyocera 96% alumina substrates | — | — | — | — | — | — | — | — | — | — |
| Aged adhesion, 570 h, 150° C. Kyocera 96% alumina substrates | — | — | 11 N | — | 22 N | 18 N | 20 N | — | — | 16 N |
| Aged adhesion, 1000 h, 150° C. Kyocera 96% alumina substrates | 6 N | 9 N | 9 N | 20 N | 19 N | 16 N | 16 N | — | — | 12 N |
| Aged adhesion, 2000 h, 150° C. Kyocera 96% alumina substrates | — | 11 N | — | 20 N | — | — | — | — | — | — |
| TCA, 240 Cycles, -50/150° C. Coors 96% alumina substrates | — | — | — | — | — | — | — | 24 N | 29 N | — |
| TCA, 500 Cycles, -50/150° C. Coors 96% alumina substrates | — | 20 N | 19 N | 18 N | 20 N | 17 N | 18 N | 8 N | 14 N | 8 N |
| TCA, 1000 Cycles, -40/125° C. Coors 96% alumina substrates | 31 N | 30 N | — | 29 N | — | — | — | — | — | — |
| TCA, 1500 Cycles, -40/125° C. Coors 96% alumina substrates | 24 N | 24 N | 21 N | 26 N | 25 N | 22 N | 19 N | — | — | 24 N |
| TCA, 2000 Cycles, -40/125° C. Coors 96% alumina substrates | 17 N | 22 N | — | — | — | — | — | — | — | — |

| | Example No. | | | | | | | | | |
|---|---|---|---|---|---|---|---|---|---|---|
| | 15 | 16 | 17 | 18 | 19 | 20 | 21 | 22 | 23 | 24 | 25 |
| Pad Thickness | 9.5 μm | 9.5 μm | 9.5 μm | 9.5 μm | 9.5 μm | 8 μm | 9 μm | 9.5 μm | 9.5 μm | 9.5 μm | 9.5 μm |
| Solderability | — | — | — | — | — | 95–100% | 95–100% | 95–100% | 95–100% | 95–100% | 95–100% |
| Solder Leach Resistance | 2 dips | 3 dips | 3 dips | 2 dips | 3 dips | 2–3 dips | 4 dips | 4 dips | 4 dips | 4 dips | 4 dips |
| Aged adhesion, 120 h, 170° C. Kyocera 96% alumina substrates | — | — | — | — | — | — | — | — | — | — | — |
| Aged adhesion, 240 h, 170° C. Kyocera 96% alumina substrates | — | — | — | — | — | — | — | 17 N | — | — | — |
| Aged adhesion, 570 h, 150° C. Kyocera 96% alumina substrates | 16 N | 16 N | 12 N | 13 N | 13 N | — | — | — | — | — | — |
| Aged adhesion, 1000 h, 150° C. Kyocera 96% alumina substrates | 12 N | 13 N | 11 N | 9 N | 11 N | 17 N | 23 N | 19 N | 22 N | 19 N | 15 N |
| Aged adhesion, 2000 h, 150° C. Kyocera 96% alumina substrates | — | — | — | — | — | 22 N | 25 N | — | — | — | — |
| TCA, 240 Cycles, -50/150° C. Coors 96% | — | — | — | — | — | — | — | — | 27 N | 27 N | 0 |

TABLE 6-continued

| Experimental Data | | | | | | | | | | | |
|---|---|---|---|---|---|---|---|---|---|---|---|
| alumina substrates | | | | | | | | | | | |
| TCA, 500 Cycles, -50/150° C. Coors 96% alumina substrates | 19 N | 21 N | 16 N | 17 N | — | 15 N | <5 N | 20 N | 5 N | 8 N | — |
| TCA, 1000 Cycles, -40/125° C. Coors 96% alumina substrates | — | — | — | — | — | 30 N | 18 N | — | — | — | — |
| TCA, 1500 Cycles, -40/125° C. Coors 96% alumina substrates | 17 N | 23 N | 18 N | 21 N | — | 30 N | 12 N | — | 13 N | 13 N | <5 N |
| TCA, 2000 Cycles, -40/125° C. Coors 96% alumina substrates | — | — | — | — | — | 18 N | 8 N | — | — | — | — |

| | Example No. | | | | | | | | | |
|---|---|---|---|---|---|---|---|---|---|---|
| | 26 | 27 | 28 | 29 | 30 | 31 | 32 | 33 | 34 | 35 |
| Pad Thickness | 9.5 μm | 9.5 μm | 9.5 μm | 9.5 μm | 10.5 | 10.5 | 10.5 | 10.5 | 10.5 | 10.5 |
| Solderability | 95–100% | 95–100% | 95–100% | — | 95–100% | 95–100% | 95–100% | 95–100% | 95–100% | 95–100% |
| Solder Leach Resistance | 4 dips | 4 dips | 4 dips | — | 5 dips | 5 dips | 5 dips | 5 dips | 5 dips | 5 dips |
| Aged adhesion, 120 h, 170° C. Kyocera 96% alumina substrates | — | 16 N | — | 0 | 17 N | — | 16 N | 17 N | 16 N | 8 N |
| Aged adhesion, 240 h, 170° C. Kyocera 96% alumina substrates | — | — | — | — | — | — | — | — | — | — |
| Aged adhesion, 570 h, 150° C. Kyocera 96% alumina substrates | — | — | — | — | — | 20 N | 16 N | — | 18 N | — |
| Aged adhesion, 1000 h, 150° C. Kyocera 96% alumina substrates | 17 N | 16 N | 20 N | — | 16 N | 19 N | 20 N | 16 N | 19 N | 7 N |
| Aged adhesion, 2000 h, 150° C. Kyocera 96% alumina substrates | — | — | — | — | — | — | — | — | — | — |
| TCA, 240 Cycles, -50/150° C. Coors 96% alumina substrates | — | — | — | — | — | — | 24 N | 29 N | 25 N | — |
| TCA, 500 Cycles, -50/150° C. Coors 96% alumina substrates | 20 N | 23 N | 19 N | 0 N | 22 N | 21 N | 15 N | 23 N | <5 N | 0 N |
| TCA, 1000 Cycles, -40/125° C. Coors 96% alumina substrates | — | — | — | — | — | — | — | — | — | — |
| TCA, 1500 Cycles, -40/125° C. Coors 96% alumina substrates | 26 N | — | 25 N | — | — | 25 N | — | — | — | — |
| TCA, 2000 Cycles, -40/125° C. Coors 96% alumina substrates | — | — | — | — | — | — | — | — | — | — |

Experiments designed to achieve high aged adhesion, high thermal cycleadhesion, and good solderability and solder leach resistance will now be described. The claimed inorganic binder chemistry is based on CuO/ZnO/Fe$_2$O$_3$, using a Bi$_2$O$_3$/PbO flux system. Alternately, NiO or Co$_3$O$_4$ can be substituted for Fe$_2$O$_3$. In Example 5, two of the reactive oxide species were left out of the inorganic binder, leaving only Bi$_2$O$_3$/PbO/CuO in the fired film. Here, adhesion after long term aging at 150° C. was low, about 6N. In Example 6, iron oxide was added to the inorganic binder system of Example 5, and aged adhesion improved to 9-11N after 1000-2000 hours at 150° C. In Example 7, zinc oxide was added to the inorganic binder system of Example 5, and again the aged adhesion increased to about 11N. Finally, in Example 8 a Bi$_2$O$_3$/PbO/CuO/ZnO/Fe$_2$O$_3$ system in accordance with the invention is disclosed that yielded approximately 20N long term aged adhesion.

In Examples 5-8, the thermal cycled adhesion was excellent over a wide range of cycles and profiles. The key difference between them was the the multicomponent inorganic binder employed in Example 8 which yielded high adhesion after 1000+ hours of aging, while the less complex binder in Examples 5-7 were not capable of developing such high aged adhesion.

The composition in Example 9 was similar to Example 8, with the addition of a small amount of glass frit replacing some of the bismuth oxide. Adhesion data were also good. In Examples 10 and 11, NiO and Co$_3$O$_4$ substituted for Fe$_2$O$_3$ (compare with Example 9). A slight reduction in aged adhesion was observed compared to the Fe$_2$O$_3$ version, though the data were still significantly higher than the version without either of these oxides (Example 7).

Compositions with mixtures of Fe$_2$O$_3$, NiO, and/or Co$_3$O$_4$ (or their suitable precursors) can also be used advantageously. A Bi$_2$O$_3$/PbO/CuO/ZnO/Fe$_2$O$_3$/NiO composition and a Bi$_2$O$_3$/PbO/CuO/ZnO/Fe$_2$O$_3$/Co$_3$O$_4$ composition are shown in Examples 14 and 15, respectively. Aged adhesion was similar to or incrementally higher than compositions using Bi$_2$O$_3$/PbO/CuO/ZnO/Fe$_2$O$_3$ described in Examples 8 and 9.

Other potential reactive transition metal oxides were also evaluated. In Examples 14-19, MnO, MgO, TiO$_2$, Y$_2$O$_3$, Cr$_2$O$_3$, and ZrO$_2$ were added to a base composition Bi$_2$O$_3$/PbO/CuO/ZnO described in Example 7. A modest improvement in aged adhesion was observed with MnO, MgO, and TiO$_2$ addition, while Y$_2$O$_3$, Cr$_2$O$_3$, and ZrO$_2$ had no noticeable effect on aged adhesion. Also, it was observed that MgO, TiO$_2$, Y$_2$O$_3$, Cr$_2$O$_3$, and ZrO$_2$ seriously degraded solderability and solder leach resistance.

Pure silver compositions are also possible with the claimed technique, as shown in Example 20. However, the solder leach resistance is not as high as compositions that contain platinum.

It has been observed that oxides and compounds of ruthenium improve aged adhesion in these systems. For example, copper bismuth ruthenate was added to a pure silver paste that employed a Bi$_2$O$_3$/PbO/CuO/ZnO/Fe$_2$O$_3$ inorganic binder system, shown in Example 21. The aged adhesion was quite high, 23–25 N. In addition, the solder leach resistance was also improved. The TCA was not as high as compositions that did not employ copper bismuth ruthenate (compare with Examples 8, 9, and 20) though the TCA was certainly high enough for many applications (18N after 1000 cycles, −40°/125° C.). Oxides and compounds of ruthenium would also improve the aged adhesion of Ag/Pt compositions under the current claim, though the TCA would also be degraded.

In Example 22, the oxide species Bi$_2$O$_3$/PbO/CuO/ZnO/Fe$_2$O$_3$ were coprecipitated from a nitrate solution, calcined at 400° C. for 6 hours, then mechanically milled to form a fine particle size distribution. This coprecipitated binder powder was formulated into a paste composition. The purpose was to determine if there was a difference with the binder species mixed on an atomic scale vs. being mixed as separate particulates. The results were similar to paste compositions where the individual oxide particles were separately added (compare Example 22 with Example 9). However, it is expected that if coarse individual oxide particles are used (approximately larger than 3–5 microns), then an admixed approach would show a degraded performance compared to Examples 9 and 22.

The effect of varying the silver powder is described in Examples 23–25. In general, approximately 20N aged adhesion was achieved with metal powders that had a high packing density and/or low particle size distribution. In Example 25, the silver powder was more agglomerated, with a tap density of only 1.0 g/cc, and the long term aged adhesion degraded to 13N. Thus, the silver powder D is not as desirable as powders A, B, or C for developing formulations with high aged adhesion, TCA, solderability and solder leach resistance. However, the claimed inorganic binder system was still effective in achieving some aged adhesion with powder D (to achieve 18+N, though, higher inorganic binder levels would be needed, with an expected degradation in solderability and solder leach resistance).

In Examples 26 and 27, the Bi$_2$O$_3$ and PbO were only present in glass frits. No separate Bi$_2$O$_3$ or PbO (or their precursors) were added to the paste formulations. Similarly, in Example 28, Bi$_2$O$_3$ and PbO were melted together at their eutectic composition, and ground into a fine powder. This eutectic melt (referred to as conductor "glass" H) was used with a minor amount of Bi-Pb-B-Si glass E, again without any other added Bi$_2$O$_3$ or PbO. The aged adhesion values of compositions 26 and 27 were nearly the same as versions using no glass frit or low amounts of glass frit (Examples 8 and 9), while composition 28 was essentially equal to compositions 8 and 9. These examples show that the binder species can be present as part of a glass or multiple glasses, although glass-free or low glass formulations are preferred.

In Example 29, the reactive oxides were used in the paste formulation, but the Bi$_2$O$_3$ and PbO were left out and no extra glass frit was used. The composition did not form a suitable liquid phase during the 850° C. firing, and so could not bond adequately with the substrate. The aged adhesion was zero.

The last set of examples relate to the claimed PbO/(PbO+Bi$_2$O$_3$) ratio. In Examples 8, 28, and 30–35, ratios ranging from 0 to 1.0 are covered. In general, desirable combinations of aged adhesion, thermal cycled adhesion, solderability, and solder leach resistance can be developed over this entire PbO/(PbO+Bi$_2$O$_3$) range, though one detail emerges at high PbO ratios. It is noted that the melting point of pure PbO is approximately 888° C., which is above the common firing temperature of 850° C. for standard air firable thick film pastes. Thus, formulations based on PbO/(PbO+Bi$_2$O$_3$) ratios of 1.0 (or nearly 1.0) will have difficulty in forming the required liquid phase. This problem is evident in Example 35, when the formulation was based on mixtures of the oxide phases PbO, CuO, ZnO, and Fe$_2$O$_3$. However, in Example 34, a similar formulation was made in which a small amount of a lead-rich, low softening point glass frit was included in the paste formulation. Thus, the necessary liquid phase was present from the Pb-rich glass, and its reaction with the PbO during the firing step. In Example 34, significant aged adhesion and thermal cycled adhesion were developed vs. the fritless version in Example 35, despite the lack of bismuth oxide.

The bismuth oxide-rich end of the formulation range is demonstrated in Examples 30 and 31. In these cases, bismuth oxide melts below the 850° C. firing temperature. Therefore, additions of a glass frit are not required to form the necessary liquid phase. Intermediate PbO/(PbO+Bi$_2$O$_3$) ratios are demonstrated in Examples 8, 28, 32, and 33.

What is claimed is:

1. A composition for making solderable electrically conductive layers comprising an admixture of finely divided particles containing by weight % (1) 85–99.9% of at least one solderable electrically conductive metal and (2) 15–0.1% of a additive composition consisting essentially of an admixture of finely divided particles of oxides or precursors of oxides of bismuth, copper, lead, zinc and a transition metal selected from iron, cobalt, nickel and mixtures thereof in which the weight ratio of (a) copper oxide to bismuth oxide and lead oxide is 0.01–2, (b) lead oxide to bismuth oxide and lead oxide is 0–1, (c) zinc oxide to bismuth oxide and lead oxide is 0.01–2, (d) transition metal oxide to bismuth oxide and lead oxide is 0.01–2.

2. The composition of claim 1 in which the weight ratio of copper oxide to bismuth oxide and lead oxide is 0.05–1.

3. The composition of claim 1 in which the weight ratio of zinc oxide to bismuth oxide and lead oxide is 0.05–1.

4. The composition of claim 1 in which the weight ratio of transition metal oxide to bismuth oxide and lead oxide is 0.05–1.

5. The composition of claim 1 in which a plurality of the oxides have been melted together prior to forming the particulate admixture.

6. The composition of claim 1 in which a plurality of the oxides are coprecipitated.

7. The composition of claim 1 in which the admixture is formed by spray drying an aqueous dispersion of the oxides.

8. The composition of claim 1 in which the admixture has been calcined at a temperature of at least 600° C., but below the temperature at which the oxides are completely molten.

9. The composition of claim 1 in which the transition metal oxide is iron oxide.

10. The composition of claim 1 in which the conductive metal is a single metal or alloy.

11. The composition of claim 1 in which the conductive metal is a plurality of metals or metal alloys of which at least one has a melting point at least 50° C. higher than the melting point(s) of the other metals or metal alloys.

12. The composition of claim 1 in which the metals or metal alloys are in the form of an admixture of metal or metal alloy particles.

13. The composition of claim 1 in which the metals or metal alloys are in the form of solid solution particles.

14. The composition of claim 1 in which the conductive metal is silver combined with up to 10% weight of at least one noble metal selected from the group consisting of Rh, Ru, Ir, Pt, Os, Re, Pd and mixtures thereof.

15. The composition of claim 14 in which the noble metal is Pt.

16. The composition of claim 1 in which the particulate admixture is dispersed in an organic medium.

17. The composition of claim 16 in which the organic medium is a matrix of volatilizable solid organic polymer.

18. The composition of claim 16 in which the organic medium is a liquid solution of organic polymer and nonvolatile solvent and the composition is of paste consistency.

19. A method for joining solder with electrically conductive metal or metal alloy layers comprising the sequential steps of:
(1) applying a layer of the composition of claim 16 to the surface of an inorganic oxide-based substrate;
(2) firing the applied layer to effect volatilization of the dispersion medium therefrom and sintering of the electrically conductive metal or metal alloy;
(3) applying molten solder to the surface of the fired layer from step (2); and
(4) cooling the applied solder to effect its solidification.

* * * * *